(12) United States Patent
Aguado Granados et al.

(10) Patent No.: US 7,979,824 B2
(45) Date of Patent: Jul. 12, 2011

(54) COST-BENEFIT OPTIMIZATION FOR AN AIRGAPPED INTEGRATED CIRCUIT

(75) Inventors: Axel Aguado Granados, Rochester, MN (US); Benjamin Aaron Fox, Rochester, MN (US); Nathaniel James Gibbs, Rochester, MN (US); Andrew Benson Maki, Rochester, MN (US); Trevor Joseph Timpane, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 433 days.

(21) Appl. No.: 12/208,469

(22) Filed: Sep. 11, 2008

(65) Prior Publication Data
US 2010/0064270 A1    Mar. 11, 2010

(51) Int. Cl.
*G06F 17/50*    (2006.01)
(52) U.S. Cl. ........ 716/106; 716/111; 716/113; 716/115; 716/132
(58) Field of Classification Search ................... 716/106, 716/111, 113, 115, 132
See application file for complete search history.

(56) References Cited

U.S. PATENT DOCUMENTS

| | | | |
|---|---|---|---|
| 6,316,347 B1 | 11/2001 | Chang et al. | |
| 6,542,371 B1* | 4/2003 | Webb | 361/708 |
| 6,780,753 B2* | 8/2004 | Latchford et al. | 438/619 |
| 7,078,352 B2* | 7/2006 | Beyer et al. | 438/739 |
| 7,253,095 B2 | 8/2007 | Lur et al. | |
| 2005/0074960 A1* | 4/2005 | Gueneau de Mussy | 438/619 |
| 2005/0074961 A1* | 4/2005 | Beyer et al. | 438/619 |
| 2006/0190846 A1* | 8/2006 | Hichri et al. | 716/1 |
| 2008/0097641 A1 | 4/2008 | Miyashita et al. | |
| 2009/0072409 A1* | 3/2009 | Nitta et al. | 257/774 |
| 2009/0243108 A1* | 10/2009 | Gosset et al. | 257/758 |
| 2010/0063781 A1* | 3/2010 | Aguado Granados et al. | 703/1 |

* cited by examiner

*Primary Examiner* — Sun J Lin
(74) *Attorney, Agent, or Firm* — Toler Law Group

(57) ABSTRACT

A computer implemented method, apparatus and program product provide automated processes for determining the most cost-effective use of airgaps in a microchip. The performance gains realized by using airgaps for a given net or layer may be calculated. These improvements may be paired to a monetary cost associated with implementing the applicable airgaps at that net/layer. The paired benefit and cost of the airgap scenario may be compared to other possible airgap uses at other layers/nets to determine which airgaps provide the best improvement for the lowest cost.

20 Claims, 7 Drawing Sheets

| NET NAME | TIMING MARGIN (NO GAPS) | MARGIN INCREASE (LAYER 1 AIRGAPPED) | MARGIN INCREASE (LAYER 2 AIRGAPPED) | MARGIN INCREASE (LAYER 3 AIRGAPPED) | MARGIN INCREASE (LAYER 4 AIRGAPPED) |
|---|---|---|---|---|---|
| E | Te | Te1 | Te2 | Te3 | Te4 |
| F | Tf | Tf1 | Tf2 | Tf3 | Tf4 |
| G | Tg | Tg1 | Tg2 | Tg3 | Tg4 |
| H | Th | Th1 | Th2 | Th3 | Th4 |

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| LAYER 1 GAPPED | N | N | N | N | N | N | N | N | N | N | N | N | Y | Y | Y | Y |
| LAYER 2 GAPPED | N | N | N | N | N | N | Y | Y | Y | Y | Y | Y | Y | Y | Y | Y |
| LAYER 3 GAPPED | N | N | Y | Y | Y | Y | Y | Y | N | N | N | N | N | N | N | Y |
| LAYER 4 GAPPED | N | Y | N | Y | N | Y | N | Y | N | Y | N | Y | N | Y | N | N |

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| LAYER1 | 0 | 22 | 20 | 42 | 1 | 23 | 21 | 43 | 8 | 30 | 28 | 50 | 9 | 31 | 29 | 51 |
| LAYER2 | 5 | 18 | 18 | 31 | 25 | 38 | 38 | 51 | 29 | 42 | 42 | 55 | 49 | 62 | 62 | 75 |
| LAYER3 | 13 | 30 | 40 | 57 | 22 | 39 | 49 | 66 | 22 | 39 | 49 | 66 | 31 | 48 | 58 | 75 |
| LAYER4 | 14 | 34 | 29 | 49 | 33 | 53 | 48 | 68 | 30 | 50 | 45 | 65 | 49 | 69 | 64 | 84 |
| MARGIN IMP. | 0 | 18 | 18 | 31 | 1 | 23 | 21 | 43 | 8 | 30 | 28 | 50 | 9 | 31 | 29 | 51 |
| ADD. COST | $0.00 | $445.00 | $176.00 | $621.00 | $307.00 | $752.00 | $483.00 | $928.00 | $394.00 | $839.00 | $570.00 | $1015.00 | $701.00 | $1146.00 | $877.00 | $1322.00 |

44 / 146 / 148

COST-BENEFIT OPTIMIZATION FOR AN AIRGAPPED INTEGRATED CIRCUIT

RELATED APPLICATIONS

The present application relates to co-pending U.S. patent application Ser. No. 12/208,548, entitled "Enhanced Conductivity in an Airgapped Integrated Circuit" by the present inventors, Axel Aguado Granados, Nathan Gibbs, Benjamin Fox, Andrew Maki, and Trevor Timpane. The co-pending application is filed concurrently herewith, and is incorporated by reference in its entirety.

FIELD OF THE INVENTION

The present invention relates to semiconductor fabrication technologies, and more particularly, to integrated circuits having airgaps in submicron processes.

BACKGROUND OF THE INVENTION

The semiconductor industry is continuously reducing the dimensions of devices. There is particular interest in minimizing the size of conductive layers in back-end-of-the-line (BEOL) processing. BEOL processing includes a portion of integrated circuit fabrication where the active components (transistors, resistors, etc.) are interconnected with wiring on a wafer. The BEOL process generally begins when the first layer of metal is deposited on the wafer. It includes contacts, insulators, metal levels, and bonding sites for chip-to-package connections.

With achievement of finer semiconductor processes, the integration and concentration of circuits in a microchip has significantly increased. While such advances provide greater capabilities, the more compact integration also narrows the spacing between circuit wires, or traces. This narrowing can increase parasitic capacitance between traces. Parasitic capacitance occurs when two adjacent traces on a microchip draw electrical energy from one another. This phenomenon generates undesirable heat and slows the speed at which data can move throughout the microchip. The increase in parasitic capacitance between traces can result in crosstalk, where an electric signal leaks between traces. Power consumption may be increased, as may resistor-capacitor time delays between interconnecting traces, or interconnects. Resistor-capacitor time delays can significantly reduce the operating speed of microchips. Such delays can also cause signals to arrive outside of designed timing margins, disrupting microchip performance.

Airgaps were developed in microelectronic fabrication by International Business Machines Corporation (IBM) to address these problems. Airgaps typically comprise vacuumed voids in the silicon dioxide substrate adjacent at least one side of a trace. The airgaps reduce the amount of capacitance between traces in the multilayer design of the microchip. Capacitance can be minimized by insulating copper wires or other conductive traces of a microchip with the vacuumed airgaps. The airgaps have a lower dielectric constant than silicon dioxide. The extremely low dielectric constant of air, i.e., "1," makes it an ideal dielectric medium for lowering the capacitance between the narrow trace configurations. The reduced capacitance of the airgap functions to increase timing margins, as well as frequency targets. The minimization of the capacitance enables microchips to work faster and draw less power.

IBM has developed a way to manufacture airgaps on a massive scale. Such processes may use the self-assembly properties of certain polymers combined with complimentary metal-oxide-semiconductor (CMOS) manufacturing techniques. During semiconductor production, the entire wafer may be prepared with a polymer material. When the polymer material is removed, trillions of selectively positioned airgaps may result. Such exemplary airgaps may be around 20 nanometers in diameter and evenly spaced.

Despite such advances in airgap fabrication processes, the hardware, masks for each layer, polymer material, software, skilled labor and processing costs represent additional costs to standard microchip design and manufacture expenses. Although airgaps are the best dielectric structures for lowering capacitance, they can thus be relatively expensive to fabricate. The additional costs associated with incorporating airgaps into the fabrication process may discourage their use. Such a reluctance may translate into the potential performance benefits of airgaps being unrealized.

A need consequently exists for an improved manner of designing and fabricating airgaps in a microchip.

SUMMARY OF THE INVENTION

The present invention provides an improved computer implemented method, apparatus and program product for designing and improving the performance of a microchip. The computer implemented method comprises automatically determining a performance attribute associated with a microchip design that includes an airgap. The performance attribute associated with the microchip design may also be automatically determined without the airgap. Based upon the automatic determinations, the computer implemented method may also perform a cost benefit analysis. Aspects of the invention may output the microchip design for implantation and fabrication.

Embodiments consistent with the invention may determine a timing related performance attribute associated with a microchip design that includes an airgap. A performance attribute associated with a net of the microchip design may be determined. A timing report may be generated. Aspects of the invention may further determine a relatively poorly performing net of the microchip design. A timing margin associated with the net of the microchip design may also be determined. Embodiments of the invention may add the airgap to a layer of the microchip design that includes the net and determine a change in a performance of a net of the microchip design. Attributes of the invention may also determine an aggregate change in performances of a plurality of nets of the microchip design associated with a layer of the microchip design, wherein determining the performance attribute further comprises comparing the aggregate change to another performance associated with another layer of the microchip design.

The computer implemented method may comprise determining the performance attribute associated with the microchip design including the airgap before determining the performance attribute associated with the microchip design without the airgap. The computer implemented method may determine the performance attribute associated with the microchip design without the airgap before determining the performance attribute associated with the microchip design including the airgap.

Performing the cost benefit analysis may further comprise determining a layer of the microchip design in which an addition of the airgap improves the microchip performance for the relatively lowest cost. Aspects of the present invention may perform the cost benefit analysis automatically.

Embodiments of the invention may comprise an apparatus, comprising a memory, a program code residing in the memory, and a processor in communication with the memory and configured to execute the program code to determine a performance attribute associated with a microchip design including an airgap. The processor may also determine a performance attribute associated with a microchip design without the airgap, as well as perform a cost benefit analysis based upon the automatic determinations. The performance attribute associated with the microchip design including the airgap may be associated with a conductive trace of the microchip design, and may include closed timing processes and/or open timing processes.

Aspects of the invention may comprise a program product, comprising program code configured to determine a performance attribute associated with a microchip design including an airgap, as well as to determine a performance attribute associated with a microchip design without the airgap. A cost benefit analysis based upon the automatic determinations may also be performed. The program product may comprise a computer readable medium bearing the program code.

These and other advantages and features that characterize the invention are set forth in the claims annexed hereto and forming a further part hereof. However, for a better understanding of the invention, and of the advantages and objectives attained through its use, reference should be made to the Drawings and to the accompanying descriptive matter in which there are described exemplary embodiments of the invention.

BRIEF DESCRIPTION OF THE DRAWINGS

FIG. 3 shows a table that reflects the propagation delay effects of adding airgaps to a layer as may be used to conduct cost-benefit analysis in a manner consistent with the underlying principles of the present invention.

FIG. 6 shows a table having all possible airgap combinations for a four layer microchip for use in conducting cost-benefit analysis in a manner consistent with the underlying principles of the present invention.

FIG. 7 shows a table having exemplary, quantified timing margins corresponding to the microchip configurations represented by the table of FIG. 6.

DETAILED DESCRIPTION

Figure 1:
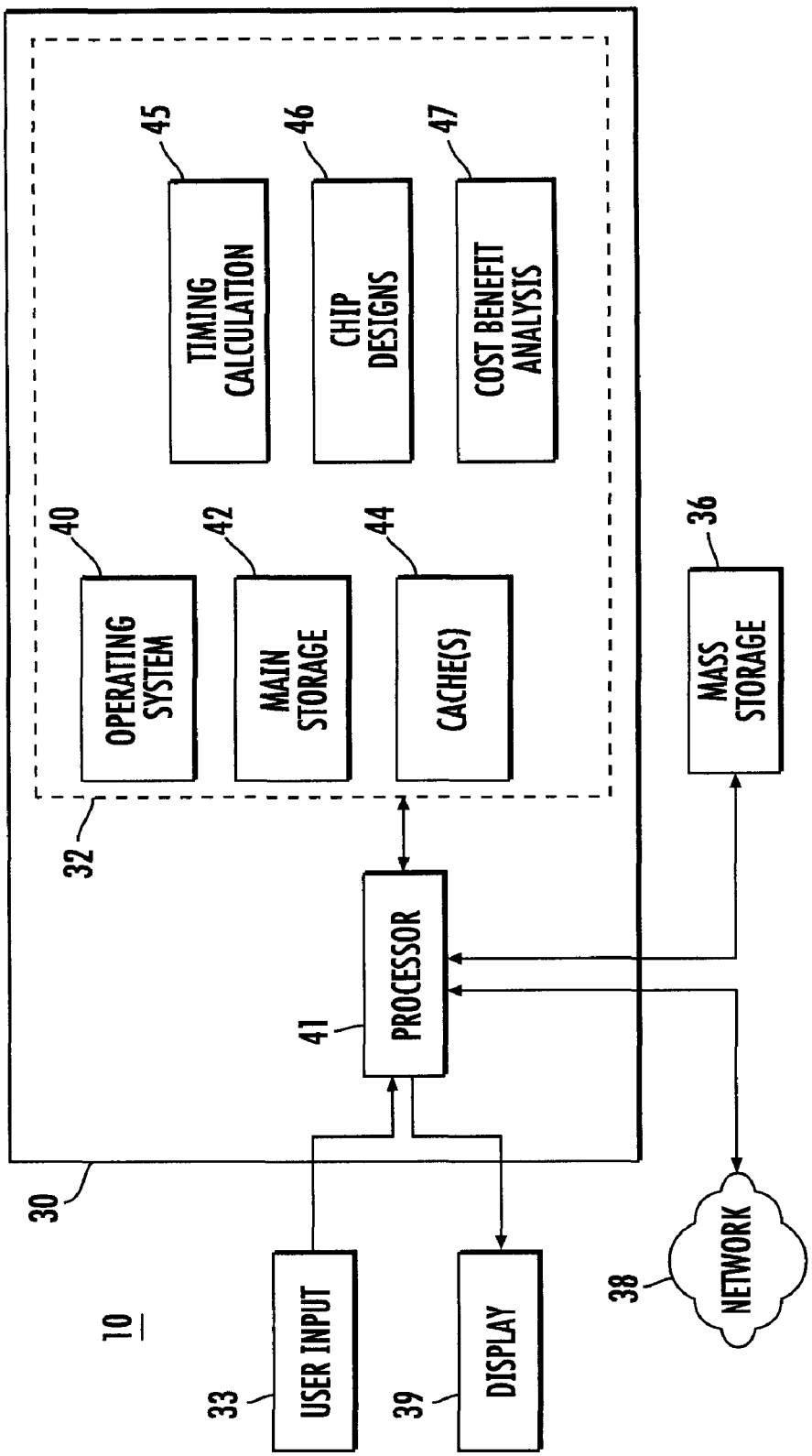
FIG. 1 shows a block diagram of a computer system configured to determine a cost-effective use of airgaps within a microchip design in accordance with the underlying principles of the present invention.

Embodiments consistent with the underlying principles of the present invention provide automated processes for determining the most cost-effective use of airgaps in a microchip. The performance gains realized by using airgaps for a given net or layer may be calculated. These improvements may be paired to a monetary cost associated with implementing the applicable airgaps at that net/layer. The paired benefit and cost of the airgap scenario may be compared to other possible airgap uses at other layers/nets to determine which airgaps provide the best improvement for the lowest cost.

Aspects of the invention provide microchip designers with a way to leverage airgap technology by balancing the benefits with the costs of adding the airgaps. Embodiments enable the intelligent determination of which layers provide the most improvement for the lowest cost.

Aspects of the invention may include a post-processing analysis of the performance of a microchip and the projected cost of adding airgaps. A timing report may be generated and automatically evaluated. The worst percentage of nets may be determined, as well as their associated timing margins. Embodiments may then calculate the improved timing margin of that percentage of nets as airgaps are added to the microchip design.

Embodiments consistent with the invention may add airgaps to each metal layer independently, and quantify the effect on the nets of concern. Generated output may report the additive improvements to timing margins that each airgap layer would bring to each of the worst nets. This benefit-related information may then be used to determine the overall performance improvements of the chip on a per-layer basis. Another process may determine the cost of each layer. This cost-related information may be evaluated to perform the cost-benefit analysis.

Processes consistent with one embodiment of the invention may begin with a microchip having no airgapped layers and that has closed timing. The system may then determine how adding layers would affect timing margins. The affected timing margins may translate into increased frequency of the product. Another embodiment may alternatively begin with a fully airgapped chip, and then provide the decrease in margin as airgaps are removed from certain layers. Yet another embodiment consistent with the invention includes a microchip that is having trouble closing timing. Aspects may be used to determine the most cost-effective layers to add airgaps so that timing margins may be met.

Embodiments consistent with the invention may be employed in connection with a microchip design having no airgaps that pass timing requirements. Processes may determine a worst percentage of the nets. For instance, the timing margins of the nets in a given microchip may be automatically plotted as a distribution. The lowest performing percentage may be determined. If the lower percentage may be improved, the distribution may shift towards larger margins. Such a result may represent an improvement of the tightest path. This tightest path may be exploited to improve performance benchmarks such as clock frequency.

Aspects of the invention may determine which layers are implicated by these worst performing nets. It is likely that all layers will be used, but this process may reduce computation time by determining which layers the algorithm is able to ignore.

Airgaps may be added to the first layer. The effect the addition has on the performance of the worst nets may be noted. This process may be completed for each layer. More particularly, the effect of adding airgaps to a layer may be quantified by the effect on the propagation delay of the net on a given layer. This data may be tabulated for this net and all of the other worst performing nets.

The system may determine which layer combination provides the best improvement in performance. This improvement may be with all layers airgapped. This feature may provide an upper bound for possible timing improvement.

More particularly, the effect of every combination of airgapped layers on the microchip's tightest margins may be determined. For a simple four layer example, there may be sixteen possible combinations. Each combination may have an associated cost, as well as an associated margin increase. Embodiments may then select the layer combination that achieves the desired margin improvement for the lowest additional cost. Since the decision to add in airgaps to a design may be made later in the design cycle, embodiments may facilitate an accurate and cost effective decision. Aspects of the invention may weigh improvements in performance against the associated costs to determine the appropriate course of action.

While the principles of this invention do not limit its forum or application, one embodiment capitalizes on the structure available through the system 10 exemplified in FIG. 1. FIG. 1 generally shows a block diagram of a networked computer device, or system 10, configured to determine a most cost-effective use of airgaps within a microchip design in accordance with the principles of the present invention. The system 10 more particularly comprises one or more client computer (s) 30 coupled to a network 38. Network 38 represents a networked interconnection, including, but not limited to local area, wide area, wireless, and public networks (e.g., the Internet). Moreover, any number of computers and other devices may be networked through network 38, e.g., multiple servers.

Computer system 10 will hereinafter also be referred to as an "apparatus," "computer," "tool," "device," or "system," although it should be appreciated that the terms may respectively include many other controller configurations. Moreover, while only one network interface device is shown in FIG. 1, any number of computers and other devices may be networked through network 38. In still another embodiment, the system 10 may be implemented in a standalone configuration, i.e., disconnected from another computer or computer network.

Computer device 30 typically includes at least one processor 41 coupled to a memory 32. Processor 41 may represent one or more processors (e.g., central processing units, microprocessors). Memory 32 may represent the SRAM devices comprising the main storage 42 of computer device 30, as well as any supplemental levels of memory, e.g., cache memories, non-volatile or backup memories (e.g., programmable or flash memories), read-only memories, etc. In addition, memory 32 may be considered to include memory storage physically located elsewhere in computer device 30, e.g., any cache memory present in processor 41, as well as any storage capacity used as a virtual memory, e.g., as stored within a database 37, or on another computer coupled to computer device 30 via network 38.

Computer device 30 also may receive a number of inputs and outputs for communicating information externally. For interface with a user, computer device 30 typically includes one or more input devices 33 (e.g., a keyboard, a mouse, a trackball, a joystick, a touch pad, iris/fingerprint scanner, and/or a microphone, among others). The computer device 30 additionally includes a display 39 (e.g., a CRT monitor, an LCD display panel, and/or a speaker, among others). It should be appreciated, however, that with some implementations of the computer device 30, direct user input and output may be unsupported by the computer, and interface with the server computer device 30 may be implemented through a computer or workstation networked with the computer device 30.

For additional storage, computer device 30 may also include one or more mass storage devices 36 configured to store, for instance, the database 37. Exemplary devices 36 can include: a floppy or other removable disk drive, a flash drive, a hard disk drive, a direct access storage device (DASD), an optical drive (e.g., a CD drive, a DVD drive, etc.), and/or a tape drive, among others. Furthermore, computer device 30 may include an interface with one or more networks (e.g., a LAN, a WAN, a wireless network, and/or the Internet, among others) to permit the communication of information with other computers coupled to the network 38. It should be appreciated that computer device 30 typically includes suitable analog and/or digital interfaces between processor 41 and each of components 32, 33, 36, 38 and 39.

Computer device 30 may operate under the control of an operating system 40, and executes various computer software and hardware applications, components, programs, modules, e.g., a main memory storage 42, a cache(s) 44, a timing calculation program 45, a microchip design 46, and a cost-benefit analysis program 47. As discussed herein, the timing calculation program 45 may determine timing margins and generate timing reports relative to the stored microchip designs 46, as applicable. This data may be stored for processing by the cost-benefit analysis program 47. The cost-benefit analysis program 47 may automatically facilitate and/or determine a most cost efficient use of airgaps in the design 46.

Various applications, components, programs, markers, modules, etc. may also execute and/or be stored on one or more processors and/or memory/caches of another computer coupled to computer device 30 via a network 38, e.g., in a distributed or client-server computing environment, whereby the processing required to implement the functions of a computer program may be allocated to multiple computers over a network. Moreover, while computer device 30 may include a networked computer device, other embodiments of the device 30 may include relatively smaller and more focused computing applications or components, such as a cellular phone, a PDA or a microchip.

In general, the routines executed to implement the embodiments of the invention, whether implemented in hardware, as part of an operating system, or as a specific application, component, program, engine, process, programmatic tool, object, module or sequence of instructions, or even a subset thereof, may be referred to herein as a "algorithm," "function," "program code," or simply "program." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. One of skill in the art should appreciate that embodiments consistent with the principles of the present invention may nonetheless use program code resident at only one or any number of locations.

Moreover, while the invention has and hereinafter will be described in the context of fully functioning computer systems, those skilled in the art will appreciate that the various embodiments of the invention are capable of being distributed as a program product in a variety of forms, and that the invention applies equally regardless of the particular type of computer readable, signal bearing media used to actually carry out the distribution. Examples of signal bearing, computer readable media include, but are not limited to tangible, recordable type media such as volatile and non-volatile memory devices, floppy and other removable disks, hard disk drives, magnetic tape, optical disks (e.g., CD ROMs, DVDs, etc.), among others, and transmission type media such as digital and analog communication links.

In addition, various program code described hereinafter may be identified based upon the application or engine within which it is implemented in a specific embodiment of the invention. However, it should be appreciated that any particular program nomenclature that follows is used merely for convenience, and thus the invention should not be limited to use solely in any specific application or engine identified and/or implied by such nomenclature.

Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

The various software components and resources illustrated in FIG. 1 may be implemented in a number of manners, including using various computer software applications, routines, components, programs, objects, modules, data structures and programs. Those skilled in the art will further recognize that the exemplary environments illustrated in FIG. 1 are not intended to limit the present invention. Indeed, those skilled in the art will recognize that other alternative hardware and/or software environments may be used without departing from the scope of the invention.

Figure 2:
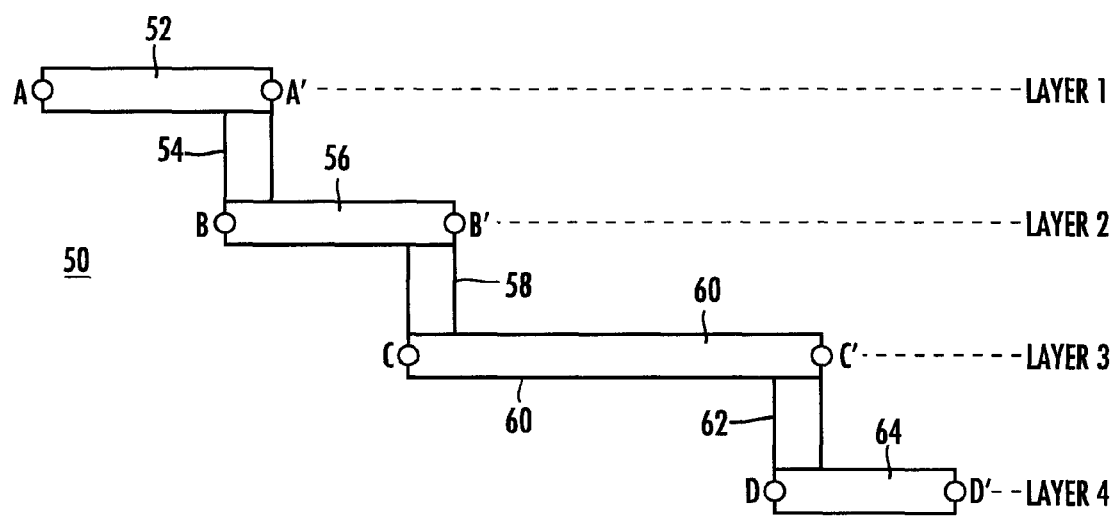
FIG. 2 shows a net spanning multiple layers of a microchip and having associated timing margins affected by the application of embodiments consistent with the underlying principles of the present invention.

FIG. 2 shows a net 50 spanning multiple layers of a microchip and having associated timing margins affected by the application of embodiments consistent with the underlying principles of the present invention. The net 50 comprises a conducted path including net segments 52, 56, 60, 64. The net segments 52, 56, 60, 64 may be respectively bounded by points A and A', B and B', C and C', and D and D'. Vias 54, 58, 62 or other connections may connect the net segments 52, 56, 60, 64 and complete the net 50.

Each net segment 52, 56, 60, 64 may correspond to respective layers of a microchip. For instance, net segment 52, bounded by points A and A', may correspond to layer 1. Net segment 56, bounded by points B and B', may correspond to layer 2. Layer 3 may include net segment 60, bounded by points C and C'. Layer 4 may include net segment 64, which is bounded by points D and D'. As discussed herein, the net 50 may include a timing margin between points A and D'.

The performance effect on a net 50 that is realized by adding airgaps on the layers used by the net may be additive on a per-layer basis. When microchip timing is completed, a net 50 may include a given time margin. For example, the timing margin may be defined between points A and D', as shown. This timing margin may be referenced as "Tnet." By adding an airgap to layer 1, the reduced capacitance may improve the propagation delay between points A and A'. This improvement may be referenced as Ta. Similarly, adding an airgap to Layers 2 through 4 may result in Tb, Tc and Td. Thus, the timing margin of adding all four airgap layers may comprise Tnet+Ta+Tb+Tc+Td.

As will be appreciated by one of skill in the art, a net 50 for purposes of this specification may include a circuit or portion of a circuit, e.g., a conductive path. The net 50 may include multiple levels of metal, transistors, capacitors, or other devices, including integrated air gap structures built according to known methods. Such airgaps may be positioned adjacent at least one side of the trace of the net 50 and/or may enclose the trace. Thus, the net 50 is not limited to any particular form, structure or circuitry.

Similarly, as used herein, the terms "on" or "onto" or "above" when used in connection with various airgap and/or trace positions are merely intended to denote a physical spatial relationship, and not necessarily a direct physical or electrical contact. It will be understood therefore by those skilled in the art that in embodiments of the invention, a first layer may be on or above a second layer, even if there are other intervening layers present.

FIG. 3 shows a table 70 that displays the effects of adding airgaps to a layer(s). The table 70 also shows the effect on the propagation delay on a given layer(s) of a net. As such, the table 70 may be used to conduct cost-benefit analysis in a manner consistent with the underlying principles of the present invention.

More particularly, column 72 of the table 70 includes the name of the net or net segment. A net segment may include a trace, circuit or portion of a circuit. The table 70 shows timing margins reflective of the addition of airgaps to the layers. The effect the addition has on the performance of the worst nets 72 may be noted. This process may be completed for each layer 76, 78, 80, 84. More particularly, the effect of adding airgaps to a layer may be quantified by the effect on the propagation delay of the net 72 on a given layer 76, 78, 80, 84.

The timing margins associated with a combination of the nets with no airgaps are shown in column 74. Column 76 of the table 70 represents timing margin increases associated with airgapping the first layer. Column 78 shows margin increases associated with airgapping the second layer of the microchip. Column 80 shows margin increases associated with airgapping a third layer of the microchip. Margin increases associated with airgapping the fourth layer of the microchip are represented in column 84.

Figure 4:
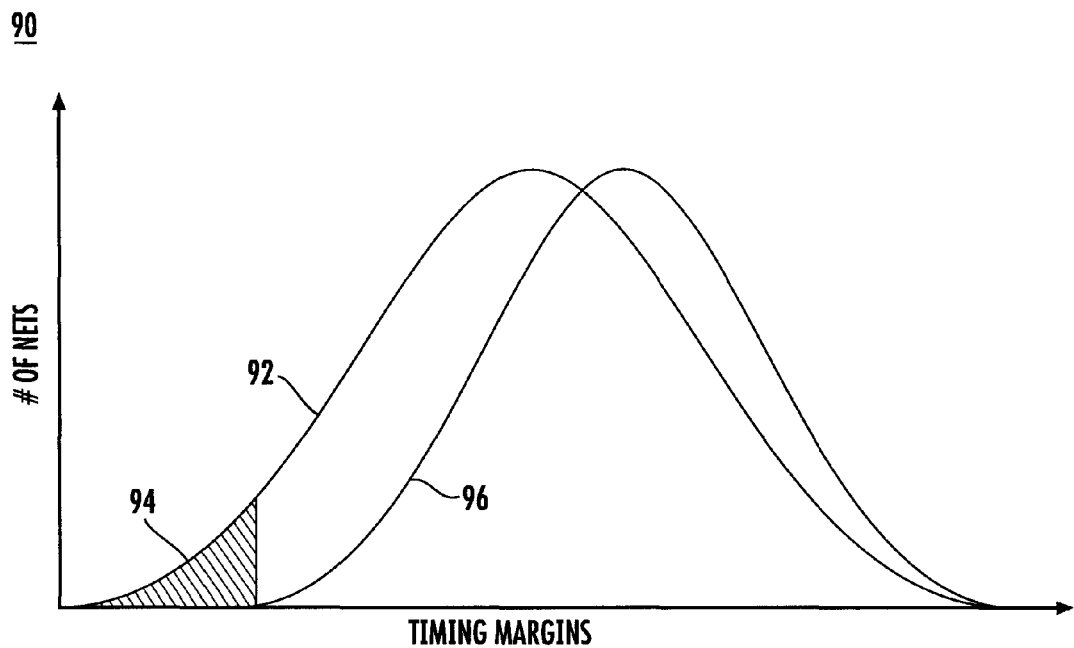
FIG. 4 shows a chart plotting timing margins associated with both standard net performance and net performance optimized in accordance with the principles of the present invention.

FIG. 4 shows a chart 90 plotting timing margins associated with both standard net performance and net performance optimized in accordance with the principles of the present invention. More particularly, the graph 90 includes two plots 92, 96. The first plot 92 may be a function of a number of nets and an associated timing margin. Shaded portion 94 represents a lowest percentage of timing margins associated with non-optimal, standard curve 92. Plot 96 shows optimized results achieved by adding an optimal number and/or placement of airgaps. As shown in the chart 90, the timing margins of the plot 96 may be improved to eliminate the most inefficient and lowest timing margins associated with prior art applications.

Figure 5:
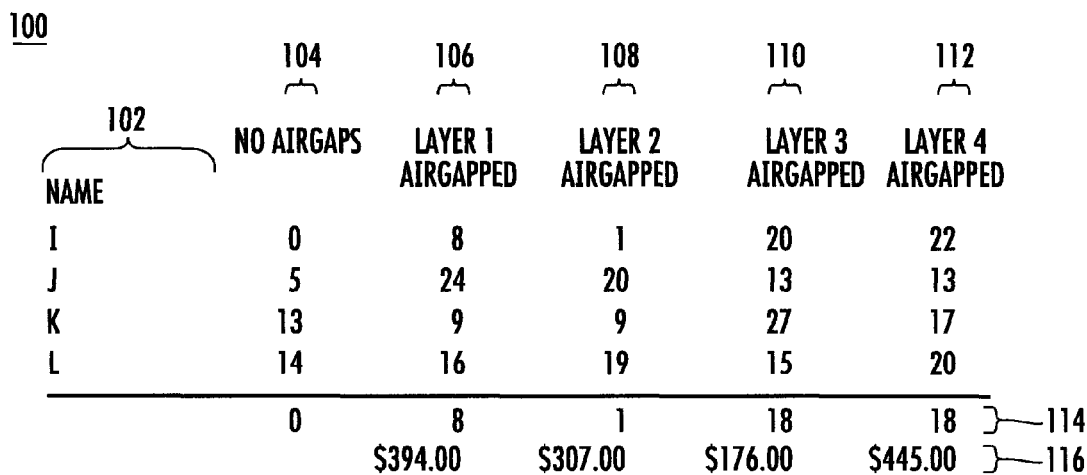
FIG. 5 shows a table that displays the worst performing nets from a timing perspective for an exemplary four layer microchip for use in conducting cost-benefit analysis in a manner consistent with the underlying principles of the present invention.

FIG. 5 shows a table 100 that shows the worst performing nets 102 from a timing perspective for an exemplary four layer microchip. The table may be used in conducting cost-benefit analysis in a manner consistent with the underlying principles of the present invention. More specifically, the table 100 shows timing margins for each net 102 in terms of potential airgapped layers. As may be appreciated by one of skill in the art, airgaps may be included along any of the net segments and/or layers as desired. The addition of airgaps may serve to reduce capacitance. As shown in the table 100, adding airgaps to each layer increases the timing margin 114. Net I, for example, just barely meets timing with no margin at all. However, adding airgaps to layer 3 gives Net I 20 picoseconds of slack.

Turning more particularly to the table 100, column 106 shows data representative of a timing margin increase achieved when a first layer of the microchip is airgapped. Column 108 shows margin increases associated with a second layer airgapped. Airgapping a third layer may achieve exemplary margin increases shown in column 110. Column 112 shows exemplary margin increases associated with airgapping a fourth layer. Row 114 of the table 100 shows a number indicative of a relative increase in timing margins. Column 116 of the table 100 shows exemplary monetary costs associated with adding the airgaps to the respective layers. As shown in table 100, adding airgaps to each layer may increase the timing margins. However, adding airgaps to certain layers may produce greater results from a cost benefit perspective. For instance and as noted above, adding airgaps to layer 3 may result in 20 picoseconds of slack for Net I, whereas adding airgaps to layer 2 for twice the cost may only improve the timing margin by 1 picosecond.

FIG. 6 shows a table 130 having all possible airgap combinations 132 for a four layer 134 microchip for use in conducting cost-benefit analysis in a manner consistent with the underlying principles of the present invention. Such combinations 132 may be automatically determined and evaluated in certain embodiments.

More particularly, the effect of every combination 132 of airgapped layers 134 on the tightest margins of the microchip may be determined. For the four layer example, there may be sixteen possible combinations. Each combination 132 may have an associated cost, as well as an associated margin increase. Embodiments may then select the layer combination 132 that achieves the desired margin improvement for the lowest additional cost. Since the decision to add in airgaps to a design 46 may be made later in the design cycle, embodiments may facilitate an accurate and cost effective decision. Aspects of the invention may weigh improvements in performance against the associated costs to determine the best course of action.

FIG. 7 shows a table 140 having exemplary, quantified timing margins corresponding to the microchip configurations represented by the table 130 of FIG. 6. For instance, the timing margins shown in FIG. 7 correspond to the combination of gapped layers shown in FIG. 6 by the appropriate combination placeholder. FIG. 7 shows a table 140 also having 16 combinations 142 and layers 144. The table 140 of FIG. 7 shows timing margin improvements 146 associated with each combination 142. Row 148 of the table 140 shows costs associated with each combination.

The advantages of embodiments consistent with the invention may be apparent when comparing combinations 2 and 3. Both combinations achieve the same timing margin, but combination 3 is significantly less expensive. A comparison between combinations 2 and 7 reveals that for a similar cost, combination 7 provides an extra 3 picoseconds of slack.

Figure 8:
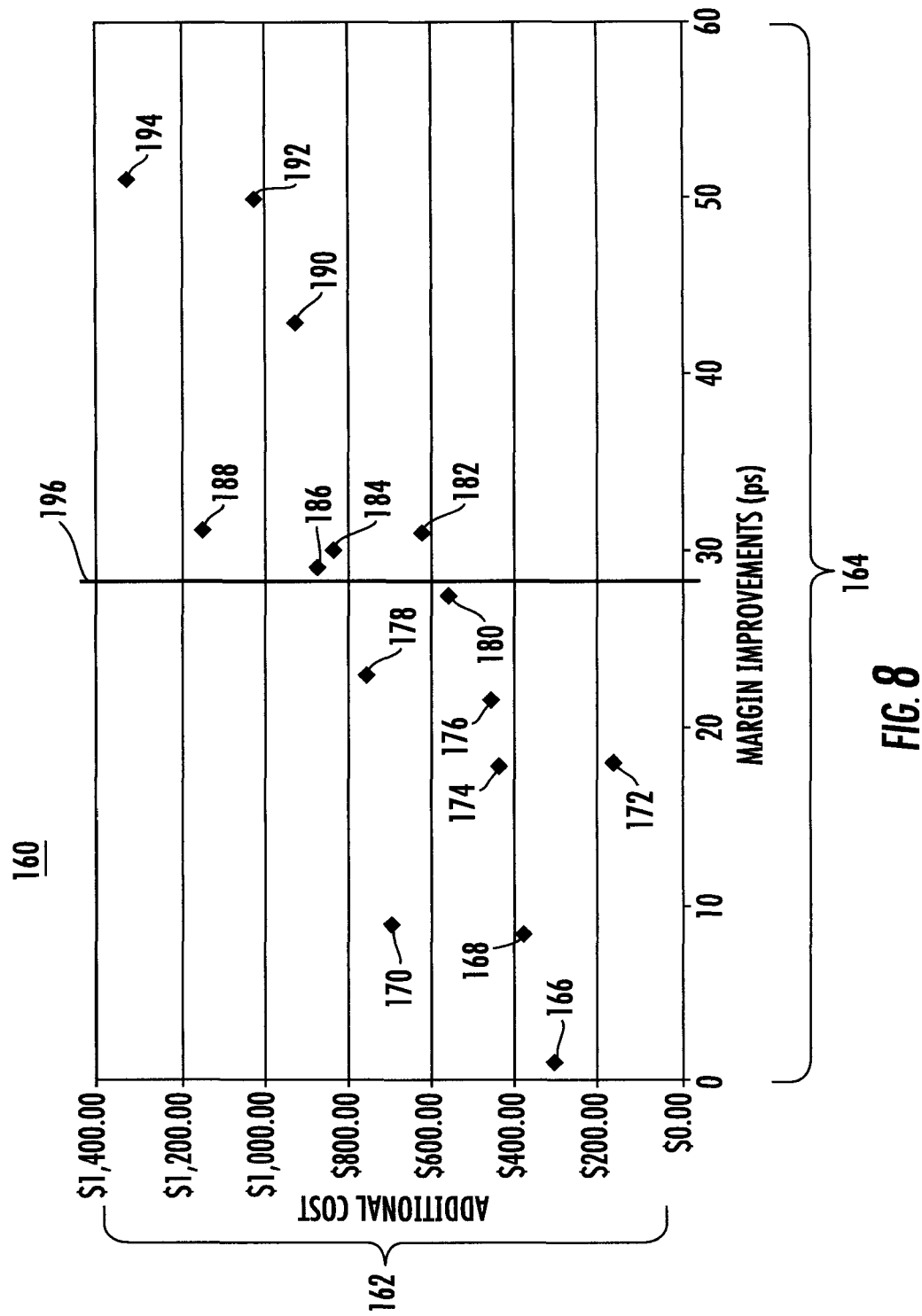
FIG. 8 shows a chart that plots points according to exemplary costs and margin improvements for use in conducting cost-benefit analysis in a manner consistent with the underlying principles of the present invention.

FIG. 8 shows a chart 160 that plots points 166, 168, 170, 172, 174, 176, 178, 180, 182, 184, 186, 188, 190, 192, 194 according to exemplary costs 162 and margin improvements 164, measured in picoseconds. The chart 160 may have use in conducting cost-benefit analysis in a manner consistent with the underlying principles of the present invention. Line 196 may delineate the desired margin improvement (around 28 picoseconds). Any plotted point to the left of the line 196 does not meet the desired margin improvement. The program code or analyst may determine from those plotted points 182, 184, 186, 188, 190, 192, 194 that meet the desired margin improvements as to which points, or point, should be selected for its cost effectiveness. For instance, point 182 may achieve the desired performance with the least cost.

Figure 9:
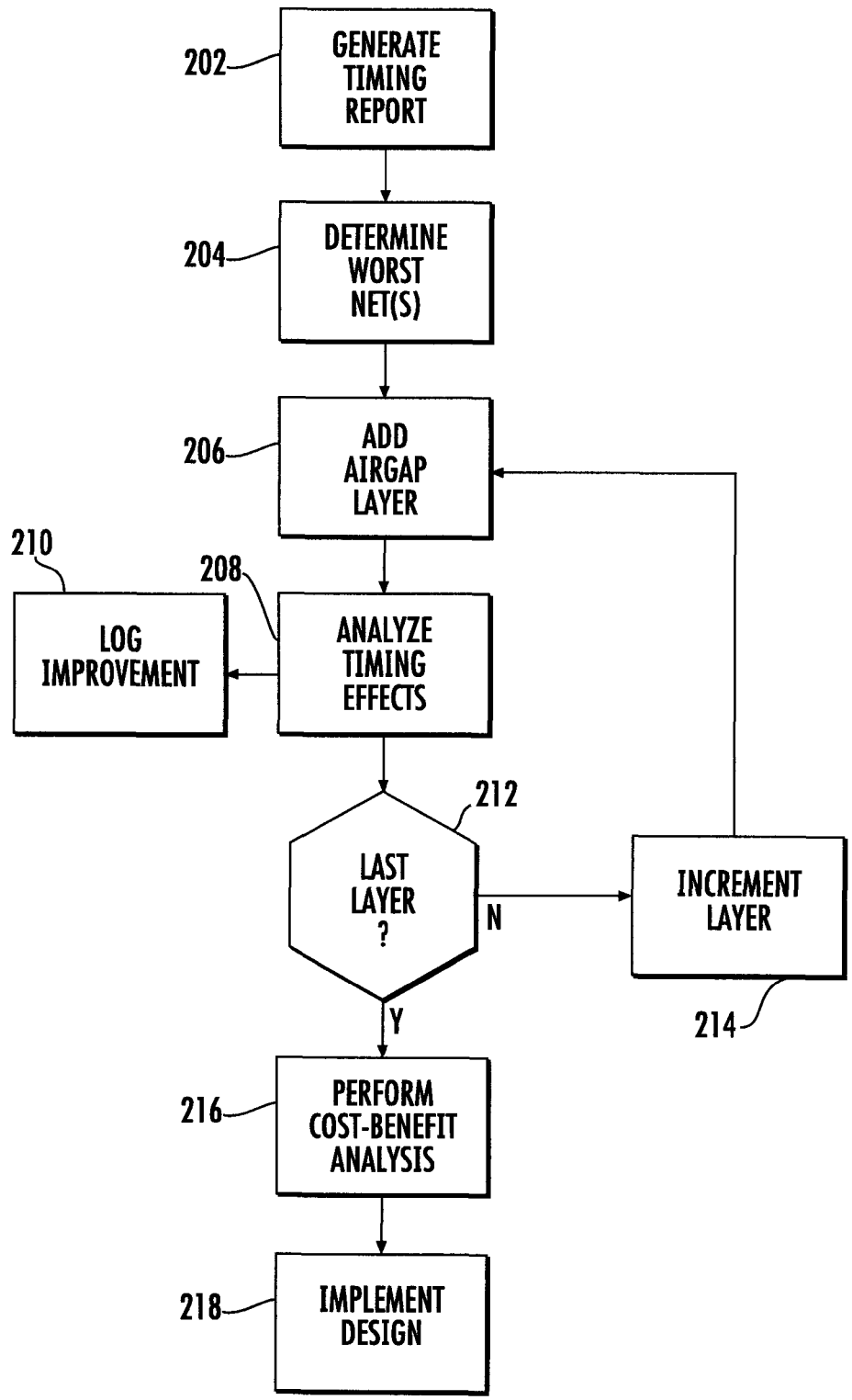
FIG. 9 shows a flowchart having steps executable by the system of FIG. 1 for optimally placing airgaps within a microchip from a cost benefit prospective.

FIG. 9 shows a flowchart 200 having steps executable by the system 10 of FIG. 1 for optimally placing airgaps within a microchip from a cost benefit prospective. Turning more particularly to the steps of the flowchart 200, the system 10 may generate at block 202 a timing report. An exemplary timing report may include timing margins associated with nets 50 and/or layers 1-4.

At block 204 of FIG. 9, the system 10 may determine one or more worst performing nets. Such performance may be determined according to timing margins noted during the generation of the timing report at block 202.

The system 10 may add airgap(s) to a layer, "n," of the microchip design 46 at block 206. The timing effects of the airgaps may be analyzed at block 212. For instance, the system 10 may determine at block 208 any improvement in timing margins. Such improvement may relate to one or multiple nets and/or layers. That is, embodiments may calculate the improved timing margin of a percentage of nets/layers of interest as airgaps are added to the microchip design 46. The system 10 may log at block 210 any improvement or other performance data associated with, for instance, the airgap addition to the layer n.

If there are other layers to be analyzed at block 212, the system 10 may increment the layer (n+1) and add airgap(s) at blocks 214 and 206, respectively. The analysis may repeat at block 208.

Should the last layer have alternatively been evaluated at block 212, then the system may perform a cost-benefit analysis at block 216. Such analysis may be automatically performed, and/or may include some manual input. That is, the system may evaluate multiple airgap scenarios to determine which design 46 is most cost effective. That design 46 may be implemented at block 218.

While the present invention has been illustrated by a description of various embodiments and while these embodiments have been described in considerable detail, it is not the intention of the Applicants to restrict, or, in any way limit the scope of the appended claims to such detail. For instance, while timing-related benefits are discussed herein, other types of benefits, such as reliability-related improvements, may have equal applicability in other embodiments. In another example, embodiments may determine airgap cost-effectiveness in instances where layers are analytically removed from a fully airgapped microchip design 46. This process results in the most cost-efficient microchip that still meets timing requirements.

Moreover, embodiments consistent with the invention may include processes that apply airgap cost-effective analysis to microchips having timing that is not closed. The underlying principles of the present invention may furthermore apply to airgap integration into VLSI applications. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. A computer implemented method for designing a microchip, the computer implemented method comprising:
automatically perfoinfing a determination on a performance attribute associated with a microchip design including an airgap;
automatically performing a determination on the a performance attribute associated with the microchip design without the airgap;
performing a cost-benefit analysis based upon the automatic determinations; and
outputting the microchip design.

2. The computer implemented method of claim 1, further comprising implementing a result based upon the cost-benefits analysis on a microchip.

3. The computer implemented method of claim 1, wherein the performing a determination on a performance attribute associated with the microchip design including the airgap further comprises determining a timing-related performance attribute.

4. The computer implemented method of claim 1, wherein performing a determination on a performance attribute associated with the microchip design including the airgap further comprises determining a performance attribute associated with a net of the microchip design.

5. The computer implemented method of claim 1, wherein the performing a determination on a performance attribute associated with the microchip design including the airgap further comprises generating a timing report.

6. The computer implemented method of claim 1, wherein the performing a determination on a performance attribute associated with the microchip design including the airgap further comprises determining a poorly performing net of the microchip design.

7. The computer implemented method of claim 1, wherein the performing a determination on a performance attribute associated with the microchip design including the airgap further comprises determining a timing margin associated with a net of the microchip design.

8. The computer implemented method of claim 7, wherein the performing a determination on a performance attribute associated with the microchip design including the airgap further comprises adding the airgap to a layer of the microchip design including the net.

9. The computer implemented method of claim 1, wherein the performing a determination on a performance attribute associated with the microchip design including the airgap further comprises determining a change in a performance of a net of the microchip design.

10. The computer implemented method of claim 1, wherein the performing a determination on a performance attribute associated with the microchip design including the airgap further comprises determining an aggregate change in performances of a plurality of nets of the microchip design associated with a layer of the microchip design.

11. The computer implemented method of claim 10, wherein the performing a determination on a performance attribute further comprises comparing the aggregate change to another performance associated with another layer of the microchip design.

12. The computer implemented method of claim 1, further comprising the performing a determination on a performance attribute associated with the microchip design including the airgap before the performing a determination on a performance attribute associated with the microchip design without the airgap.

13. The computer implemented method of claim 1, further comprising determining the performance attribute associated with the microchip design without the airgap before determining the performance attribute associated with the microchip design including the airgap.

14. The computer implemented method according to claim 1, wherein the performing the cost-benefit analysis further comprises determining a layer of the microchip design in which an addition of the airgap improves the microchip performance for the lowest cost.

15. The computer implemented method according to claim 1, wherein the performing the cost-benefit analysis further comprises automatically performing the cost-benefit analysis.

16. An apparatus, comprising:
a memory;
program code residing in the memory; and
a processor in communication with the memory and configured to execute the program code to perform an automatic determination on a performance attribute associated with a microchip design including an airgap, to perform an automatic determination on the a performance attribute associated with a the microchip design without the airgap, and to perform a cost-benefit analysis based upon the automatic determinations.

17. The apparatus of claim 16, wherein the performance attribute associated with the microchip design including the airgap is associated with a conductive trace of the microchip design.

18. The apparatus of claim 16, wherein the microchip design includes closed timing processes.

19. The apparatus of claim 16, wherein the microchip design includes open timing processes.

20. A program product, comprising:
program code configured to a processor to cause the processor to perform an automatic determination on a performance attribute associated with a microchip design including an airgap, to perform an automatic determination on the performance attribute associated with the microchip design without the airgap, and to perform a cost-benefit analysis based upon the automatic determinations; and
a non-transitory computer readable medium bearing the program code.

* * * * *